(12) United States Patent
Jain et al.

(10) Patent No.: US 6,613,682 B1
(45) Date of Patent: Sep. 2, 2003

(54) METHOD FOR IN SITU REMOVAL OF A DIELECTRIC ANTIREFLECTIVE COATING DURING A GATE ETCH PROCESS

(75) Inventors: Mohit Jain, Santa Clara, CA (US); Thorsten Lill, Sunnyvale, CA (US); Jeff Chinn, Foster City, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/422,816

(22) Filed: Oct. 21, 1999

(51) Int. Cl.[7] .................. H01L 21/302; H01L 21/3065
(52) U.S. Cl. .................. 438/706; 438/720; 438/723; 438/724
(58) Field of Search .................. 438/706, 723, 438/720, 724

(56) References Cited

U.S. PATENT DOCUMENTS

| | | | |
|---|---|---|---|
| 4,713,141 A | 12/1987 | Tsang | 156/643 |
| 4,948,462 A | 8/1990 | Rossen | 156/643 |
| 5,372,673 A * | 12/1994 | Stager et al. | 438/8 |
| 5,436,205 A * | 7/1995 | Hirose | 438/572 |
| 5,492,597 A * | 2/1996 | Keller | 438/721 |
| 5,565,681 A | 10/1996 | Loewenhardt et al. | 250/305 |
| 5,605,601 A | 2/1997 | Kawasaki | 156/643.1 |
| 5,668,038 A * | 9/1997 | Huang et al. | 438/396 |
| 5,753,533 A | 5/1998 | Saito | 437/192 |
| 5,759,920 A * | 6/1998 | Burns, Jr. et al. | 438/696 |
| 5,779,926 A | 7/1998 | Ma et al. | 216/67 |
| 5,866,483 A | 2/1999 | Shiau et al. | 438/720 |

FOREIGN PATENT DOCUMENTS

| | | | |
|---|---|---|---|
| EP | 0516043 | 12/1992 | H01L/21/321 |
| FR | 731501 A1 * | 9/1996 | H01L/21/321 |
| JP | 03062518 | 3/1991 | H01L/21/302 |
| JP | 05234961 | 9/1993 | H01L/21/302 |
| JP | 06283477 | 10/1994 | H01L/21/302 |
| JP | 408064603 * | 3/1996 | |

OTHER PUBLICATIONS

Araki, Formation of Wiring, English Abstract of JP 408064603A. 2 pages, Mar. 1996.*

S. C. Abraham et al., "Performance of different etch chemistries on titanium nitride antireflective coating layers and related selectivity and microloading improvements for submicron geometries obtained with a high–density metal etcher", *J. Vac. Sci. Technol.* A 15(3), pp. 702–706 (1997).

(List continued on next page.)

*Primary Examiner*—Benjamin L. Utech
*Assistant Examiner*—Lynette T. Umez-Eronini
(74) *Attorney, Agent, or Firm*—Shirley L. Church; Joseph Bach

(57) ABSTRACT

The present invention provides a method for the simultaneous removal of an oxygen and/or nitrogen-containing dielectric antireflective coating ("DARC") during plasma etching of an underlying layer in a film stack. According to the method of the invention, the film stack is etched using a plasma containing reactive fluorine species. The concentration of reactive fluorine species within the plasma is controlled based on one or more of the following factors: the oxygen content of the antireflective coating, the nitrogen content of the antireflective coating, the thickness of the antireflection coating layer, and the thickness of the underlying film stack layer. The disclosure of the invention provides preferred combinations of plasma source gases which provide for the simultaneous removal of an oxygen and/or nitrogen-containing DARC layer during etching of an underlying etch stack layer, where the underlying stack layer comprises a metal silicide, polysilicon, or a metal. Also provided herein is a formula for determining the total amount of DARC removed using a given etch process recipe, based on the etch selectivity of the particular process recipe

19 Claims, 4 Drawing Sheets

OTHER PUBLICATIONS

Q. He et al., "Inorganic Antireflective Coating Process for Deep–UV Lithography", *SPIE*, vol. 3334, pp. 337–340 (1998).

M. Zaleski et al., "Tungsten Silicide/Polysilicon Stack Etching using Mixed Fluorine–Chlorine Chemistry in a High Density Plasma Chamber", *Electrochem. Soc. Proc.*, vol. 98–4, pp. 203–209.

Copy of Search Report in PCT Application Ser. No. PCT/US00/41356, mailed May 16, 2001.

* cited by examiner

METHOD FOR IN SITU REMOVAL OF A DIELECTRIC ANTIREFLECTIVE COATING DURING A GATE ETCH PROCESS

BACKGROUND OF THE INVENTION

1. Field of the Invention

The present invention pertains to a method for the simultaneous removal of an oxygen and/or nitrogen-containing dielectric antireflective coating ("DARC") during plasma etching of an underlying layer in a film stack.

2. Brief Description of the Background Art

In the field of semiconductor device fabrication, photoresists have been developed which are responsive to shorter wavelengths within the electromagnetic spectrum to enable the patterning of small-dimensioned electronic and optical devices. An example of one such class of photoresists are the deep ultraviolet photoresists ("DUV"), which are responsive to the shorter wavelengths in the ultraviolet region of the electromagnetic spectrum to pattern small dimensioned electronic and optical devices. The dimensions patterned with DUV photoresist are significantly smaller than device dimensions patterned using traditional or I-line photoresists.

Generally, a photoresist is used to provide a pattern on the surface of a stack of layers that are to be patterned in subsequent processing steps. The photoresist and some of the layers in the stack may be consumed in part or in whole during the process of patterning underlying layers which become part of the functioning device.

To take advantage of the spacial resolution capability available through ultraviolet wavelength imaging techniques, it is necessary to use an antireflective coating ("ARC") layer underneath the photoresist layer. The ARC layer provides several advantages to the fabrication process. First, the ARC layer tends to planarize the stack surface. Second, the ARC layer cuts down on light scattering from the surface into a DUV photoresist. The attenuation in light scattering from the surface the ARC layer aids in the definition of small images. Finally, the ARC layer minimizes standing wave effects and improves image contrast. Thus, the ultimate result of the ARC layer is to enable an accurate pattern replication.

Recently, there has been increased interest in the use of silicon oxynitride as an anti-reflective coating due to its ability to function well in combination with DUV photoresist. Silicon oxynitride typically (but not by way of limitation) has a formula of $SiO_xN_y$, where x ranges from about 0 to about 2, and y ranges from about 0 to about 1.33. By changing the composition of the silicon oxynitride ARC layer, one can control the refractive index (n) and the extinction coefficient (k) of the ARC layer. The refractive index and extinction coefficient, in combination with the thickness of the ARC layer, control reflection into the photoresist during imaging of the photoresist layer.

Use of silicon oxynitride as an ARC enables efficient suppression of the reflection from underlying layers while providing superior chemical properties. Silicon oxynitride's chemical properties prevent photoresist poisoning. Photoresist poisoning occurs when the surface underlying the photoresist reacts with moisture, thereby forming anionic basic groups ($NH_2$) which react with the photogenerated acid that is responsible for the development of the photoresist.

However, despite the advantages of ARC usage described above, when an ARC layer (such as silicon oxynitride) acts as a dielectric, residual ARC layer presence in an etched film stack (and ultimately within the device) may affect the performance of the device. In such instances, the entire dielectric ARC (DARC) layer should be removed, so that no residual DARC layer is present to interfere with device performance. Currently, an additional step must be performed in order to remove the residual DARC layer. This additional processing step increases production throughput time and cost. Therefore, finding a means to perform removal of the DARC layer during the plasma etching of an underlying etch stack layer would be advantageous.

SUMMARY OF THE INVENTION

The present invention provides a method which allows the simultaneous removal of an oxygen and/or nitrogen-comprising DARC layer during plasma etching of an underlying etch stack layer, using a plasma containing reactive fluorine species. We have observed that the use of a plasma source gas containing an inorganic fluorine-comprising compound, such as $CF_4$, $SF_6$, or $NF_3$, permits the simultaneous removal of a DARC layer during a polycide, metal, or polysilicon gate etch step. One of the preferred embodiment DARCs is silicon oxynitride.

We have discovered preferred combinations of plasma source gases which provide for the simultaneous removal of an oxygen and/or nitrogen-containing DARC layer during etching of an underlying etch stack layer, where the underlying stack layer comprises a metal silicide, polysilicon, or a metal. Frequently, the plasma source gas includes chlorine and HBr as well as a source of fluorine species, because of the ability of chlorine and bromine, once energized, to etch the underlying etch stack layer. Increasing the ratio of fluorine to chlorine and/or bromine in the plasma source gas typically increases the etch rate of the DARC relative to the etch rate of the underlying etch stack layer. Additionally, an increase in the substrate bias voltage will typically increase the etch rate of the DARC relative to the etch rate of an underlying etch stack layer. Further, decreasing the oxygen and/or nitrogen content of the DARC layer will also typically tend to increase the etch rate of the DARC layer relative to the underlying etch stack layer.

In addition, we have developed a method useful in semiconductor processing for determining etch process conditions which provide for simultaneous removal of essentially all residue of an oxygen-containing antireflective coating layer during pattern etching of at least one underlying layer in a film stack, wherein said film stack comprises said oxygen-containing antireflective coating layer residue, said at least one underlying layer to be etched, and at least one hard mask layer beneath said underlying layer to be etched. The method includes a number of steps:

1) performing a series of experiments necessary to establish at least one analytical function, Sel=f (X flow rate), where X represents a fluorine-comprising feed gas used to create an etch plasma,
   where $Sel_{min}=d_{underlying\ layer}/(d_{antireflective\ coating\ layer}+d_{hard\ mask\ layer})$,
   where $Sel_{max}=d_{underlying\ layer}/d_{antireflective\ coating\ layer}$,
   where $d_{underlayer}$=thickness of the underlying layer,
   where $d_{antireflective\ coating\ layer}$=thickness of the antireflective coating layer,
   and where $d_{hard\ mack\ layer}$=thickness of the hard mask layer;

2) selecting X flow rate so that $Sel_{max}$ is greater than Sel (X flow rate), which is greater than $Sel_{min}$;

3) etching a pattern into the at least one underlying layer to be etched and determining:

a) is essentially all of the residue of said oxygen-containing antireflective coating layer removed during etching, and if it is not, increasing X flow rate, b) is the hardmask layer sufficiently intact to be functional, and if it is not, decreasing X flow rate, c) does a profile of the pattern etched into the underlying layer meet a predetermined requirement, and if it does not, adjusting at least one process variable selected from the group consisting of source power, bias power, and process chamber pressure; and 4) repeating step 3) until essentially all of the residue of the oxygen-containing antireflective coating layer is removed, said hard mask layer is sufficiently intact to be functional, and said profile of the pattern meets said predetermined requirement.

In one embodiment, the hard mask layer is an oxide-comprising layer.

DETAILED DESCRIPTION OF THE INVENTION

1. DEFINITIONS

Figure 1:
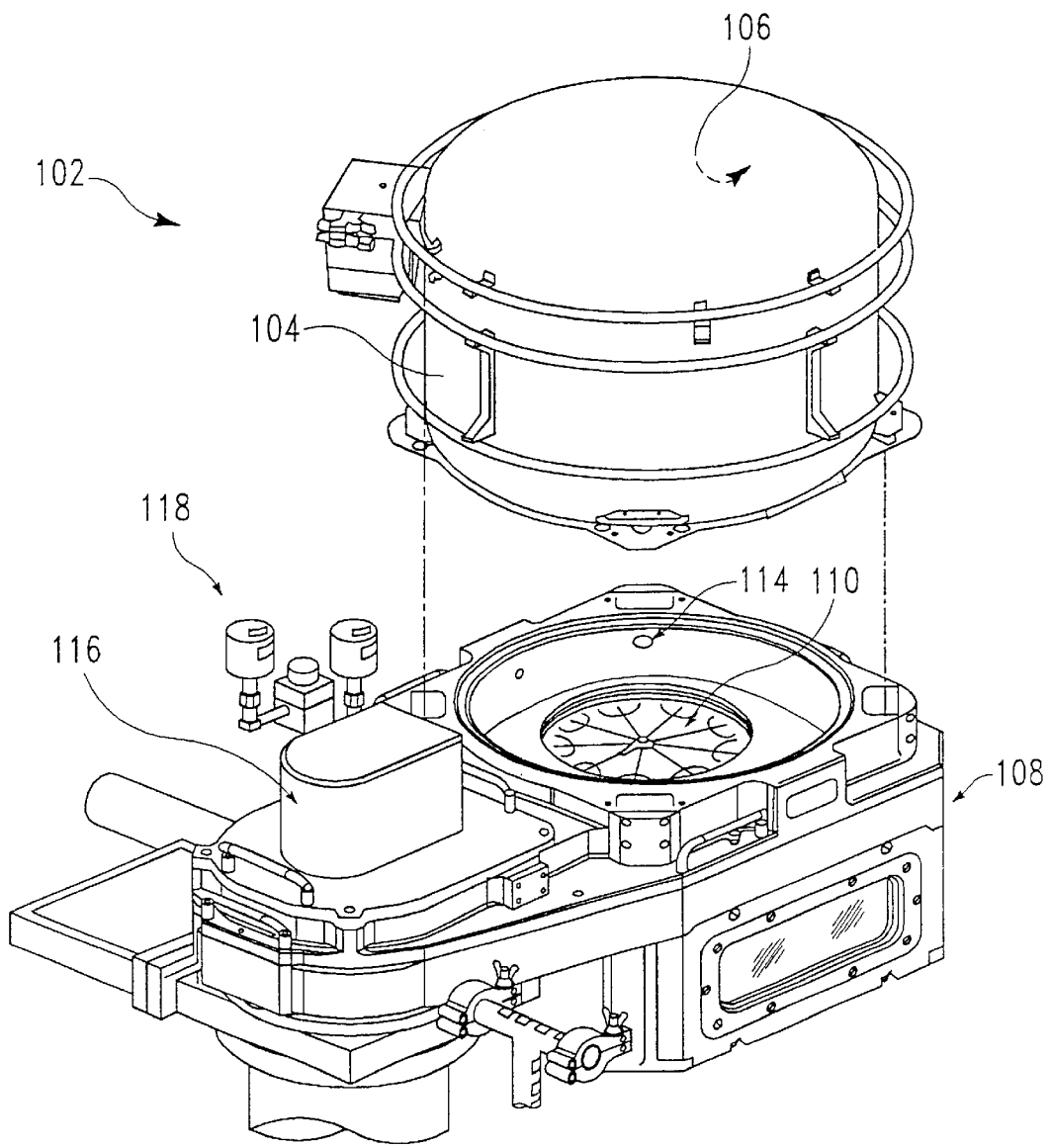
FIG. 1 is a schematic of an individual polysilicon etch chamber 102 of the type used in an Applied Materials' CENTURA® DPS™ polysilicon etch system, which is a preferred example of an etch processing apparatus for performing the method of the invention.

As a preface to the detailed description, it should be noted that, as used in this specification and the appended claims, the singular forms "a", "an", and "the" include plural referents, unless the context clearly dictates otherwise. Thus, for example, the term "semiconductor" includes a variety of different materials which are known to have the behavioral characteristics of a semiconductor, reference to "a conductive material" includes metals such as aluminum, copper, platinum, iridium, rubidium, and combinations and alloys thereof, as well as other conductive materials which would be suitable in the application described.

Specific terminology of particular importance to the description of the present invention is defined below.

The term "antireflective coating", "antireflective layer", "ARC", "dielectric antireflective coating", "dielectric antireflective layer", or "DARC" includes materials which are applied to a surface to reduce its reflection of electromagnetic radiation.

The term "dielectric ARC" or "dielectric-comprising ARC" refers to an ARC which comprises a dielectric material.

The term "doped polysilicon" refers to polysilicon which contains small amounts of various elements which are introduced to tailor the chemical, physical, and/or electrical properties of the polysilicon. Various dopants which are added to polysilicon include, without limitation, boron, nitrogen, phosphorus, and arsenic.

The term "etch stack" or "film stack" refers to a collection of layers of different materials deposited one over the other, at least a portion of which are etched during an etching process.

The term "feature" refers to, but is not limited to, contacts, vias, trenches, and other structures which make up the topography of the substrate surface.

The term "feature size" typically refers to the smallest dimension of a feature (i.e., the shortest distance between the sidewalls of a feature).

The term "polycide gate stack" refers to, but is not limited to a film stack which includes, from bottom to top, a silicon substrate, followed by a gate oxide, followed by a polysilicon layer, followed by a metal (typically tungsten) silicide layer.

The term "polysilicon", as used herein, is intended to encompass both doped and undoped polysilicon.

The term "selectivity" or "etch selectivity" is used to refer to (a) a ratio of etch rates of two materials; and (b) a condition achieved during etch when etch rate of one material is increased in comparison with another material. Note that there are various kinds of materials included in a stack of layers used in an etching process. As used herein, the term "selectivity" typically refers to the ratio of the etch rate of an underlying film stack layer (such as a metal silicide, polysilicon, or metal layer) to the etch rate of a DARC layer.

The term "source power" refers to the power that is responsible for sustaining the plasma and providing the energy to high energy species in the chamber.

The term "substrate" includes semiconductor materials, glass, ceramics, polymeric materials, and other materials of use in the semiconductor industry.

The term "tungsten" includes alloys of tungsten of the kind typically used in the semiconductor industry.

The term "underlying etch stack layer" or "underlying film stack layer" refers to a single layer in the etch stack or film stack.

2. AN APPARATUS FOR PRACTICING THE INVENTION

The present invention may be practiced in any apparatus adapted to expose a substrate to a plasma. Preferably the apparatus is capable of applying a bias voltage to the substrate. An apparatus which has provided excellent results employs an inductively coupled plasma, where the power supply to an inductive coil which sustains the plasma (the source power) and the power supply to bias the substrate (the bias power) are independently controlled. This enables the selection of a desired plasma density independently of the selection of the amount of energy with which ion bombardment occurs upon the substrate surface.

However, the present invention may be practiced in an apparatus having a plasma source power and bias power which are not separately controllable, or in any other type of apparatus adapted to expose a substrate to a plasma.

The CENTURA® DPS™ silicon etch system available from Applied Materials, Inc. of Santa Clara, Calif. is an example of a system which provides independent control of the source power supply and the bias power supply.

Figure 2:
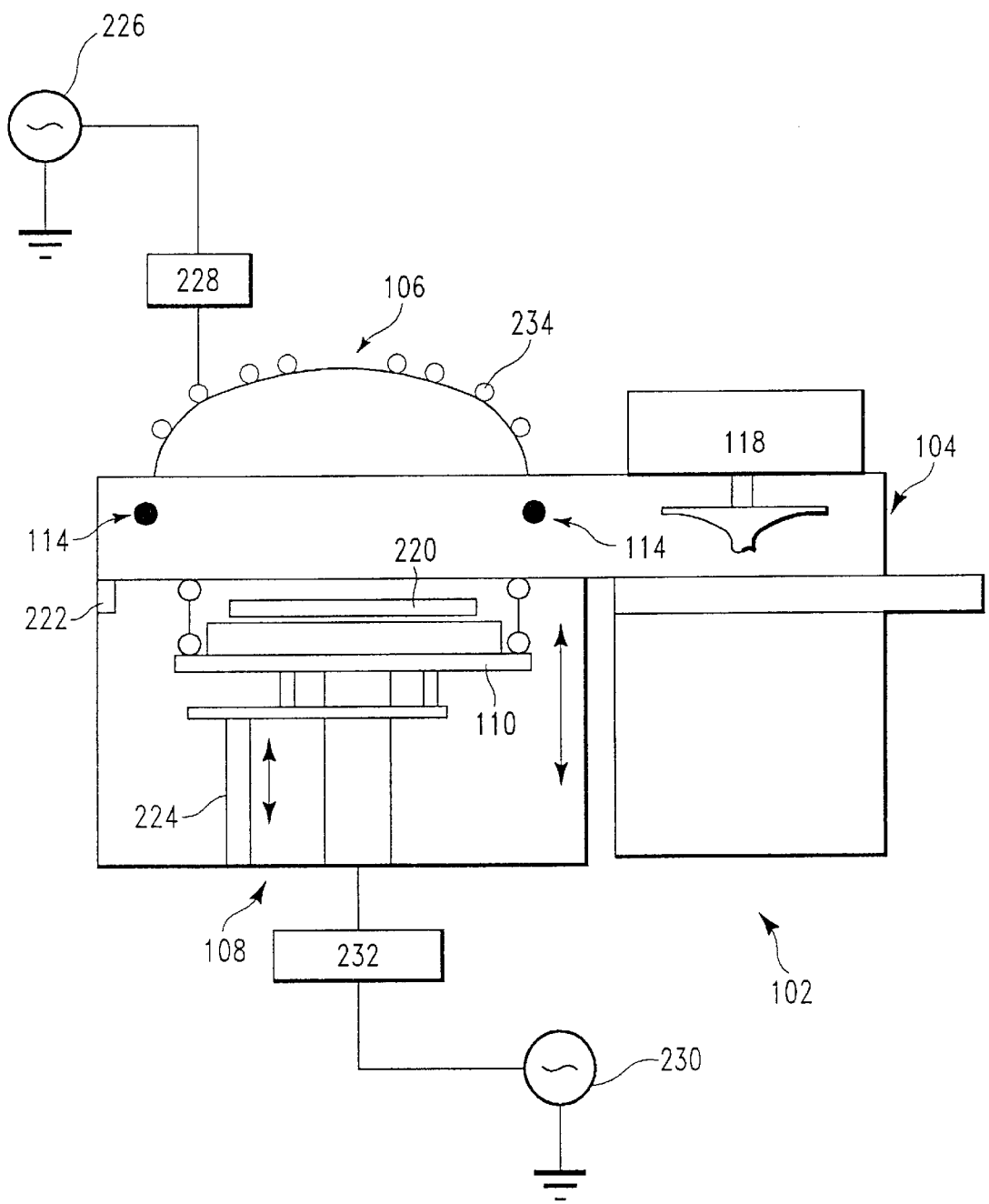
FIG. 2 shows a cross-sectional side view of the polysilicon etch chamber 102 shown in FIG. 1.

FIGS. 1 and 2 are schematics of an individual CENTURA® DPS™ polysilicon etch chamber 102 of the type used in the Applied Materials' CENTURA® polysilicon etch system. The CENTURA® DPS™ polysilicon etch chamber 102 is configured to be mounted on a standard CENTURA® 5200 etch mainframe. The polysilicon etch chamber 102 consists of an upper chamber 104 having an internal ceramic dome 106, and a lower chamber 108. The lower chamber 108 includes a monopolar electrostatic chuck (ESC) cathode 110. Gas is introduced into the chamber via ceramic gas injection nozzles 114. Chamber pressure is controlled by a closed-loop pressure control system 118 with a throttle valve 116.

FIG. 2 shows a schematic of a cross-sectional side view of a polysilicon etch chamber 102. During processing, a substrate 220 is introduced into the lower chamber 108 through inlet 222. The substrate 220 is held in place by means of a charge generated on the surface of electrostatic chuck (ESC) cathode 110 by applying a DC voltage to a conductive layer (not shown) located under a dielectric film (not shown) on the chuck surface. The cathode 110 and substrate 220 are then raised by means of a wafer lift 224 and so that cathode 110 and substrate 220 are raised into position for processing. Etch gases are introduced into the upper chamber 104 via the ceramic gas injection nozzles 114. The polysilicon etch chamber 102 employs an inductively coupled plasma generated using inductive coil 234, to which power is applied via source power 226 and matching network 228 operating at 12.56 MHZ, for generating and sustaining a high density plasma. The wafer 220 is biased by application of power applied through cathode 110 via an RF source 230 and matching network 232 operating at 13.56 MHZ. The plasma source power 226 and substrate biasing via RF source 230 are controlled by separate controllers (not shown).

An endpoint subsystem (not shown) senses the end of the etch process by monitoring changes in the light emitted by the plasma in the etch chamber 102. The standard CENTURA® DPS™ endpoint system consists of a monochromator and photomultiplier tube which automatically endpoints all etch chambers. A fiber optic cable routes light from a recessed quartz window on the chamber to the monochromator or an optional HOT (High Optical Throughput) pack photomultiplier. When the monochromator is used, light is shone into a motor-driven concave grating. Light is then reflected onto the entrance slit on the photomultiplier tube, which amplifies the light. This data is then displayed on a PC monitor. The operator sets an algorithm which controls the endpoint detection system. Etching can be programmed to terminate as the end point is approached or after the endpoint occurs. An appropriate endpoint is selected depending on the films being etched.

3. THE METHOD FOR IN SITU REMOVAL OF A DIELECTRIC ANTI-REFLECTIVE COATING DURING A GATE ETCH PROCESS

We have developed several etch chemistries that allow the simultaneous removal of a DARC layer during the etch of an underlying polycide, metal, or polysilicon layer. Table I, below, lists various etch chemistries that allow the simultaneous removal of a DARC layer during the etch of an underlying material layer according to the method of the invention.

TABLE I

| LAYERS ETCHED | PLASMA SOURCE GAS | PREFERRED GAS RATIO |
| --- | --- | --- |
| DARC/Polysilicon | $CF_4/HBr/Cl_2/He/O_2$ | 1:20 to 20:1 $CF_4$:(HBr and $Cl_2$) |
| DARC/Polysilicon | $CF_4/Cl_2/N_2$ | 1:10 to 10:0 ($CF_4$:$Cl_2$) |
| DARC/Polysilicon | $CF_4/Cl_2/O_2$ | 1:10 to 10:0 ($CF_4$:$Cl_2$) |
| DARC/Tungsten silicide | $CF_4/Cl_2/N_2$ | 1:5 to 5:0 ($CF_4$:$Cl_2$) |
| DARC/Tungsten silicide | $SF_6/Cl_2/N_2$ | 1:20 to 1:1 ($SF_6$:$Cl_2$) |
| DARC/Tungsten silicide | $NF_3/Cl_2/He/O_2$ | 1:20 to 1:1 ($NF_3$:$Cl_2$) |
| DARC/Tungsten | $SF_6/Cl_2$ | 1:10 to 5:0 ($SF_6$:$Cl_2$) |
| DARC/Tungsten | $SF_6/N_2$ | 1:10 to 5:0 ($SF_6$:$N_2$) |
| DARC/Tungsten | $SF_6/HBr$ | 1:10 to 5:0 ($SF_6$:HBr) |
| DARC/Tungsten | $NF_3/Cl_2/HBr$ | 1:10 to 10:1 ($NF_3$:$Cl_2$ and HBr) |

In the $CF_4/Cl_2/N_2$ system, $CF_4$ comprises about 10% to about 100% by volume of the total gas volume; $Cl_2$ comprises 0 to about 80% by volume of the total gas volume; and $N_2$ comprises about 0 to about 40% of the total gas volume. In the $SF_6/Cl_2/N_2$ system, $SF_6$ comprises about 5% to about 50%, more typically, about 5% to about 20%, of the total gas volume; $Cl_2$ comprises 0 to about 90%, more typically, about 60% to about 90%, of the total gas volume; and $N_2$ comprises 0 to about 50%, more typically, 0 to about 25%, of the total gas volume. In the $NF_3/Cl_2/He/O_2$ system, $NF_3$ comprises about 5% to about 50%, more typically, about 10% to about 40%, of the total gas volume; $Cl_2$ comprises 0 to about 95%, more typically, about 40% to about 90%, of the total gas volume; $He/O_2$ comprises 0 to about 50%, more typically, 0 to about 20%, of the total gas volume. Helium is commonly used as a carrier gas for $O_2$ because the small volumes required for $O_2$ are difficult to control.

The preferred ratio of fluorine to chlorine or bromine in the plasma source gas depends on a number of factors, including, for example, a) the chemical composition of the DARC film, and the technique used for its deposition; b) the chemical composition of underlying film stack layers, and the techniques used for their deposition; and c) the thickness of the DARC film and underlying layers to be removed.

For each etch chemistry, experiments were performed using differing ratios of each constituent gas in order to determine the optimal ranges of processing conditions for each system. Typical process conditions which were employed in combination with the various etch chemistries are presented in Table II, below.

TABLE II

| Process Condition | Typical Range | Preferred Range |
| --- | --- | --- |
| Total Gas Flow (sccm) | 50–300 | 100–250 |
| Source Power (W) | 200–1800 | 300–900 |
| Bias Power (W) | 20–300 | 40–125 |
| Source Power: Bias Power | 12:1 to 2:1 | 10:1 to 4:1 |
| Process Chamber Pressure (mTorr) | 1–25 | 3–9 |
| Substrate Temperature (° C.) | −20–100 | 0–75 |
| He Back Pressure (Torr) | 0–20 | 4–12 |

Prior to reaching the gate oxide layer, the etch chemistry is typically changed to an etch chemistry having a higher selectivity toward etching the underlying metal silicide, polysilicon, or metal layer relative to the DARC layer. The gate oxide tends to be etched by the same etchant gases as the DARC layer. Therefore, upon approaching the gate oxide layer, the etch chemistry is typically switched to a non-fluorine etch chemistry, which is typically an HBr and chlorine-based chemistry. For example, when the remainder of the underling layer to be etched is polysilicon, the etchant gas composition typically includes HBr, $Cl_2$, and $He/O_2$. As a result, the amount of DARC layer removed in this step is minor compared with the amount of DARC layer removed during the main etch step.

A formula for determining the total amount of DARC removed using a given etch process, based on the etch selectivity of each step (which depends on the particular process recipe) is provided below.

Total DARC Removed=A summation of the portion of the DARC removed in each etch process step, where the portion of the DARC removed in a given process step is:

$$\frac{\text{The thickness of an individual underlying layer etched}}{\text{(Etch rate of the underlying layer/etch rate of the DARC layer)}} \times 1 + (\% \text{ Overetch}/100)$$

Typically, most of the DARC layer is removed in a single process step, which is commonly a fluorine-based etch step. The etch step which includes fluorine in the etchant recipe etches the DARC at a much higher rate relative to an underlying substrate layer than a non-fluorine-containing etch step recipe, in general. In such a case, the amount of DARC removed in non-fluorine-containing etch steps may be relatively negligible. This permits an approximation of the total amount of DARC removed based solely on the etch selectivity of the process step having the fluorine present.

4. EXAMPLES OF SIMULTANEOUS REMOVAL OF DARC LAYER DURING ETCHING OF AN UNDERLYING FILM STACK LAYER

Two experiments were performed. In the first experiment, described in Example One, below, a series of wafers were etched using the $CF_4/Cl_2/N_2$ etch chemistry to simultaneously remove silicon oxynitride during a tungsten silicide etch. In the second experiment, described in Example Two, below, a single wafer was etched using the $CF_4/HBr/Cl_2/He/O_2$ etch chemistry to simultaneously remove silicon oxynitride during etching of a doped polysilicon layer. Example Three provides a hypothetical example for the simultaneous removal of silicon oxynitride during a tungsten metal etch, utilizing a fluorine-based etch chemistry.

EXAMPLE ONE

Figure 3:
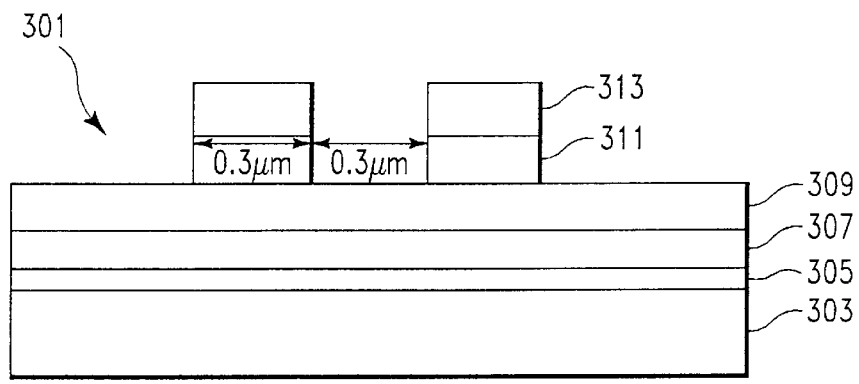
FIG. 3 shows a schematic of a cross-sectional view of the Example One etch stack where the DARC is silicon oxynitride and the "underlying etch stack layer" is tungsten silicide, which overlies, from top to bottom, a polysilicon layer, a gate oxide layer, and a substrate.

In this set of experiments, a silicon oxynitride DARC layer was etched simultaneously during a polycide gate etch process. FIG. 3 shows the various layers of the particular film stack used in this set of experiments. The film stack 301 included, from top to bottom, a silicon oxynitride layer 313, having a thickness of about 800 Å; a "TEOS" (tetraethyl orthosilicate) deposited silicon oxide layer 311, having a thickness of about 1300 Å; a tungsten silicide layer 309, having a thickness of about 800 Å; a doped polysilicon layer 307, having a thickness of about 1500 Å; and a gate oxide layer 305, having a thickness of about 70 Å, all deposited on a single-crystal silicon substrate 303. The film stack 301 was patterned using a conventional photoresist, which was removed prior to etching the silicon oxynitride and tungsten silicide layers. The TEOS-deposited silicon oxide layer 311 has been partially etched away in steps preceding the removal of the photoresist. FIG. 3 also shows the silicon oxynitride layer 313 partially removed.

Five wafers having the structure shown in FIG. 3, where the majority of the residual DARC layer of silicon oxynitride is removed during etch of a tungsten silicide ($WSi_x$) film. The etchant gas composition for etching of the tungsten silicide film was $CF_4/Cl_2N_2$. The specific process conditions used and etch results obtained are presented in Table III, below.

TABLE III

| Process Condition | Wafer Number | | | | |
|---|---|---|---|---|---|
| | 1 | 2 | 3 | 4 | 5 |
| $CF_4$ Flow (sccm) | 32 | 32 | 40 | 40 | 70 |
| $Cl_2$ Flow (sccm) | 120 | 120 | 100 | 70 | 40 |
| $N_2$ Flow (sccm) | 16 | 16 | 0 | 0 | 0 |
| Process Chamber Pressure (mTorr) | 4 | 4 | 4 | 4 | 4 |
| Source Power (W) | 280 | 500 | 350 | 270 | 270 |
| Bias Power (W) | 100 | 100 | 120 | 90 | 90 |
| Substrate Temperature (° C.) | 40 | 40 | 40 | 40 | 47 |
| Helium Back Pressure (Torr) | 8 | 8 | 8 | 8 | 8 |
| $WSi_x$: DARC Etch Selectivity | 1.45 | 1.45 | 1.47 | 1.31 | 1.22 |
| DARC Removed (Å) | 667 | 667 | 600 | 670 | 730 |

A lower $WSi_x$: DARC etch selectivity is necessary for removal of the DARC layer. If the selectivity toward etching tungsten silicide relative to the DARC layer is too high, then the DARC layer cannot be removed. However, if the $WSi_x$: DARC selectivity is too low, the TEOS-deposited silicon oxide layer 311 could be damaged or pinholes could form in the film stack 301, causing punch-through of the gate oxide layer 305. The experiments indicated that the amount of silicon oxynitride removed was related to the volumetric flow rate ratio of $CF_4:Cl_2$. For example, increasing the volumetric flow rate ratio from 4:7 to 7:4 $CF_4:Cl_2$ (Wafer Nos. 4 and 5) lowered the selectivity toward etching the tungsten silicide relative to the silicon oxynitride layer (i.e., the tungsten silicide etch rate divided by the silicon oxynitride etch rate) from 1.31 to 1.22. The wafers etched using a plasma source gas having a higher fluorine concentration showed greater silicon oxynitride removal, but also increased the undercut of the silicide layer. However, these experiments also indicated that the addition of $N_2$ to the plasma source gas reduced the silicide undercut which resulted from the increased fluorine concentration in the plasma.

The results of these experiments indicate that the $WSi_x$: DARC etch selectivity can be lowered by performing one or more of the following process modifications: (1) increasing the ratio of fluorine to chlorine in the plasma source gas; (2) increasing the bias power, while maintaining a constant source power; and (3) lowering the oxygen and/or nitrogen content of the DARC layer (for example, a $SiO_{0.8}N_{0.05}$ ARC layer would have a higher selectivity than a $SiO_{0.05}N_{0.05}$ layer).

EXAMPLE TWO

Figure 4:
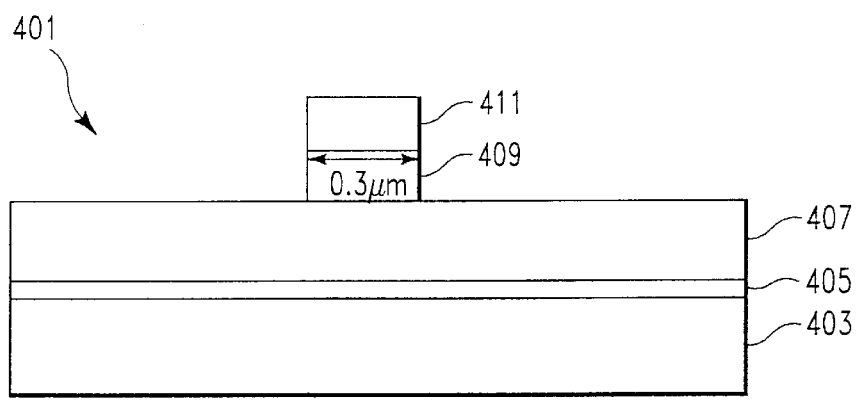
FIG. 4 shows a schematic of a cross-sectional view of the Example Two etch stack where the DARC is silicon oxynitride and the "underlying etch stack layer" is doped polysilicon, which overlies, from top to bottom, a gate oxide layer and a substrate.

In this experiment, residual silicon oxynitride DARC layer was removed simultaneously during etching of a doped polysilicon gate. FIG. 4 shows the various layers of the particular film stack used in this set of experiments. The film stack 401 included, from top to bottom, a silicon oxynitride layer 411, having a thickness of about 570 Å; a TEOS deposited silicon oxide layer 409, having a thickness of about 500 Å; a doped polysilicon layer 407, having a thickness of about 2000 Å; and a gate oxide layer 405, having a thickness of about 52 Å, all deposited on a single-crystal silicon substrate 403. The film stack 401 was patterned using a conventional photoresist, which was removed prior to etching the silicon oxynitride and doped polysilicon layers. The TEOS-deposited silicon oxide layer 407 has been partially etched away in steps preceding the removal of the photoresist. FIG. 4 also shows the silicon oxynitride layer 409 partially removed.

One wafer having the structure shown in FIG. 4 (where the the majority of the residual DARC layer of silicon oxynitride is removed during etch of a polysilicon gate) was etched using $CF_4/HBr/Cl_2/He/O_2$ etch chemistry. The specific process conditions used and etch results obtained are presented in Table IV, below.

TABLE IV

| Process Condition | |
|---|---|
| $CF_4$ Flow (sccm) | 20 |
| HBr (sccm) | 113 |
| $Cl_2$ Flow (sccm) | 38 |
| $He/O_2$ (70:30) Flow (sccm) | 8 |
| Process Chamber Pressure (mTorr) | 4 |
| Source Power (W) | 700 |
| Bias Power (W) | 100 |
| Substrate Temperature (° C.) | 40 |
| Helium Back Pressure (Torr) | 8 |
| Polysilicon: DARC Etch Selectivity | 2.5 |
| DARC Removed (Å) | 570 |

The results of this experiment indicated that increasing the concentration of the fluorine-comprising gas ($CF_4$) in the plasma source gas lowered the selectivity toward etching the polysilicon relative to the DARC layer. The optimum volume fraction of $CF_4$ for use in etching the film stack shown in FIG. 4 was found to be about 10% of the total flow rate, using the process conditions set forth in Table IV. A 10% volume fraction of $CF_4$ was found to remove the entire silicon oxynitride layer, while providing an acceptable polysilicon etch profile.

The results of this experiment indicate that the polysilicon: DARC etch selectivity can be lowered by performing one or more of the following process modifications: (1) increasing the ratio of fluorine to chlorine and bromine in the plasma source gas; (2) increasing the bias power, while maintaining a constant source power; and (3) lowering the oxygen and/or nitrogen content of the DARC layer.

EXAMPLE THREE

Figure 5:
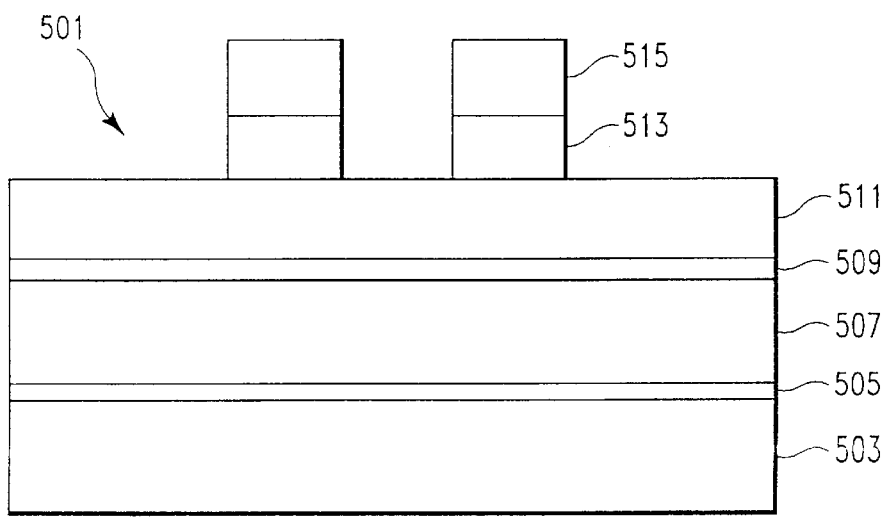
FIG. 5 shows a schematic of a cross-sectional view of the Example Three etch stack where the DARC is silicon oxynitride and the "underlying etch stack layer" is tungsten metal, which overlies, from top to bottom, a titanium nitride layer and/or a tungsten nitride layer, a polysilicon layer, a gate oxide layer, and a substrate.

The method of the present invention could also be used for the simultaneous removal of a DARC layer during a tungsten metal gate etch process. FIG. 5 illustrates a typical film stack including a tungsten metal layer. The film stack 501 includes, from top to bottom, a silicon oxynitride layer 515, having a thickness of about 1100 Å; a TEOS deposited silicon oxide layer 513, having a thickness of about 1000 Å; a tungsten layer 511, having a thickness of about 1000 Å; a titanium nitride barrier layer 509, having a thickness of about 300 A; an N+ and P+ doped polysilicon layer 507, having a thickness of about 1500 Å; and a gate oxide layer 505, having a thickness of about 70 Å, all deposited on a single-crystal silicon substrate 503. The film stack 501 is typically patterned using a conventional photoresist, which is removed prior to etching the silicon oxynitride and tungsten layers. The TEOS-deposited silicon oxide layer 513 is partially etched away in steps preceding the removal of the photoresist. FIG. 5 also shows the silicon oxynitride layer 515 partially removed.

Because tungsten metal is being etched (rather than a silicon-comprising layer), a wafer having the structure shown in FIG. 5 is preferably etched using one of the following etch chemistries: $SF_6/N_2$, $SF_6/Cl_2$, or $NF_3/Cl_2/$HBr. Typical etch process conditions are presented in Table V, below, for each of the three different etch chemistries.

TABLE V

| Process Condition | Etch Chemistry | | |
|---|---|---|---|
| | $SF_6/N_2$ | $SF_6/Cl_2$ | $NF_3/Cl_2/$HBr |
| $SF_6$ Flow (sccm) | 100 | 50 | — |
| $NF_3$ Flow (sccm) | — | — | 50 |
| $N_2$ Flow (sccm) | 100 | — | — |
| $Cl_2$ Flow (sccm) | — | 150 | 50 |
| HBr Flow (sccm) | — | — | 100 |
| Process Chamber Pressure (mTorr) | 4 | 4 | 4 |
| Source Power (W) | 500 | 500 | 500 |
| Bias Power (W) | 50 | 125 | 75 |
| Substrate Temperature (° C.) | 50 | 50 | 50 |
| Helium Back Pressure (Torr) | 8 | 8 | 8 |

We expect that the tungsten: DARC etch selectivity can be lowered by performing one or more of the following process modifications: (1) increasing the concentration of $SF_6$ or $NF_3$ in the plasma source gas; (2) increasing the bias power, while maintaining a constant source power; and (3) lowering the oxygen and/or nitrogen content of the DARC layer.

Figure 6:
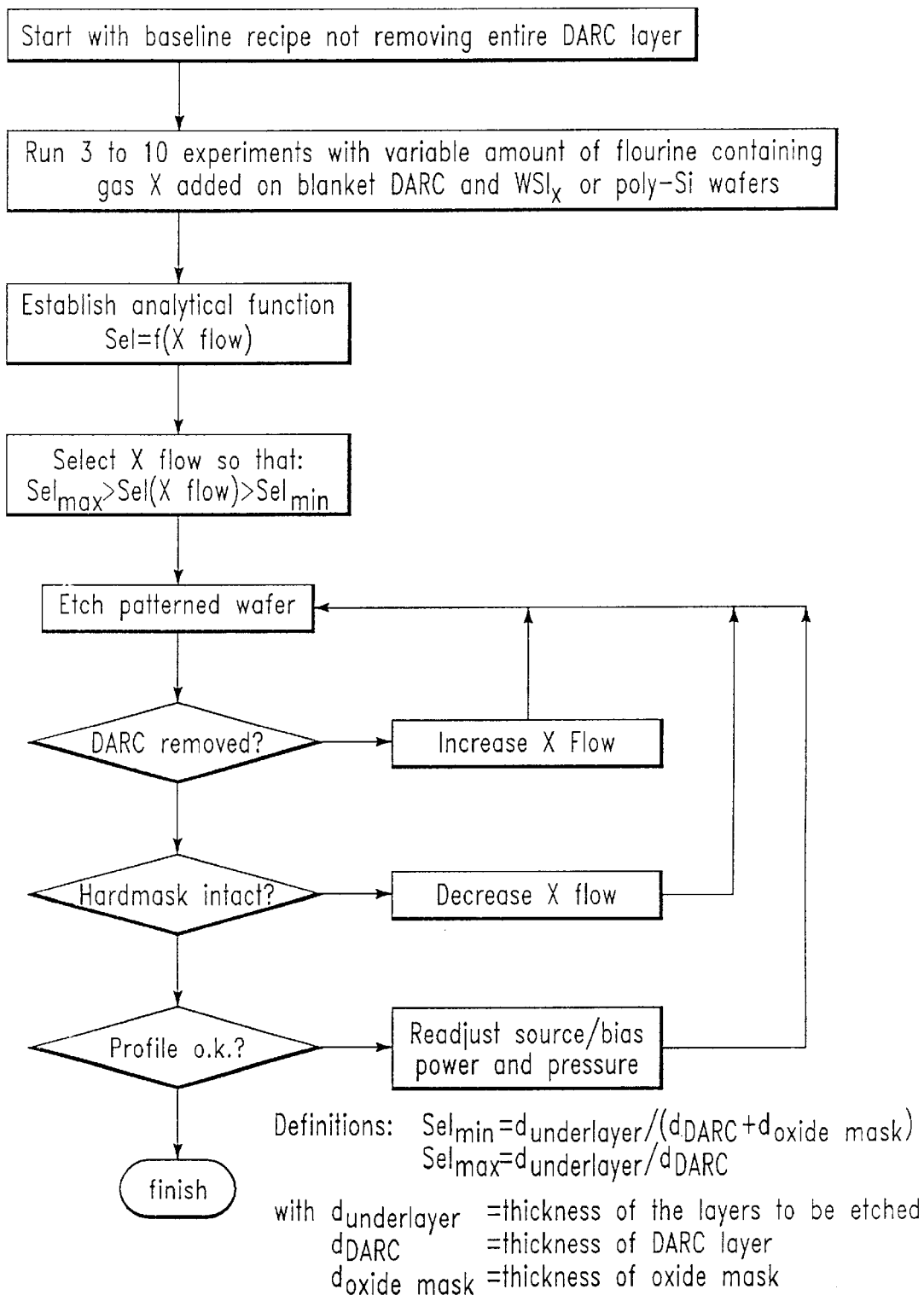
FIG. 6 is a process flow diagram for a method of determining the adjustment of process variables required to enable removal of the entire residual DARC layer during the etch through of an underlying film layer.

Based on our research and development described above, we have formulated a method for determining process variable adjustment necessary to provide for removal of an entire residual DARC layer during etch through of an underlying layer (film) in an etch stack. That method is illustrated in FIG. 6. One skilled in the art can use this method for a variety of different material compositions and different relative layer (film) thicknesses.

The above-described preferred embodiments are not intended to limit the scope of the present invention, as one skilled in the art can, in view of the present disclosure expand such embodiments to correspond with the subject matter of the invention claimed below.

We claim:

1. A method for simultaneously removing an oxygen-containing antireflective coating layer during patterned etching of at least one underlying layer in a film stack, comprising: using a plasma containing reactive fluorine species during pattern etching of a layer directly underlying an oxygen-containing antireflective coating layer, to completely remove said antireflective coating layer during etching of said directly underlying layer, and wherein the concentration of said reactive fluorine species is controlled based on at least one factor selected from the group consisting of the oxygen content of said antireflective coating, the nitrogen content of said antireflective coating, the thickness of said antireflective coating, and the thickness of said directly underlying film stack layer which is etched using said reactive fluorine species.

2. The method of claim 1, wherein said antireflective coating comprises silicon oxynitride.

3. The method of claim 2, wherein said directly underlying layer etched using reactive fluorine species comprises a metal silicide.

4. The method of claim 3, wherein said metal silicide is tungsten silicide.

5. The method of claim 4, wherein said silicon oxynitride layer and said tungsten silicide layer are etched using a plasma generated from a source gas comprising $CF_4$, $Cl_2$, and $N_2$.

6. The method of claim 4, wherein said silicon oxynitride layer and said tungsten silicide layer are etched using a plasma generated from a source gas comprising $SF_6$, $Cl_2$, and $N_2$.

7. The method of claim 4, wherein said silicon oxynitride layer and said tungsten silicide layer are etched using a plasma generated from a source gas comprising $NF_3$, $Cl_2$, and $He/O_2$.

8. The method of claim 2, wherein said directly underlying layer etched using reactive fluorine species comprises polysilicon.

9. The method of claim 8, wherein said polysilicon is doped.

10. The method of claim 8, wherein said silicon oxynitride layer and said polysilicon layer are etched using a plasma generated from a source gas comprising $CF_4$, HBr, $Cl_2$, and $He/O_2$.

11. The method of claim 8, wherein said silicon oxynitride layer and said polysilicon layer are etched using a plasma generated from a source gas comprising $CF_4$, $Cl_2$, and $N_2$.

12. The method of claim 8, wherein said silicon oxynitride layer and said polysilicon layer are etched using a plasma generated from a source gas comprising $CF_4$, $Cl_2$, and $O_2$.

13. The method of claim 2, wherein said directly underlying layer is tungsten.

14. The method of claim 13, wherein said silicon oxynitride layer and said tungsten layer are etched using a plasma generated from a source gas comprising $SF_6$ and $Cl_2$.

15. The method of claim 13, wherein said silicon oxynitride layer and said tungsten layer are etched using a plasma generated from a source gas comprising $SF_6$ and $N_2$.

16. The method of claim 13, wherein said silicon oxynitride layer and said tungsten layer are etched using a plasma generated from a source gas comprising $SF_6$ and HBr.

17. The method of claim 13, wherein said silicon oxynitride layer and said tungsten layer are etched using a plasma generated from a source gas comprising $NF_3$, $Cl_2$, and HBr.

18. A method useful in semiconductor processing which provides for simultaneous removal of essentially all residue of an oxygen-containing antireflective coating layer during pattern etching of at least one directly underlying layer in a film stack, wherein said film stack comprises said oxygen-containing antireflective coating layer residue, said directly underlying layer to be etched, and at least one hard mask layer beneath said directly underlying layer to be etched said method comprising:

1) performing a series of experiments necessary to establish at least one analytical function, Sel=f(X flow rate), where X represents a fluorine-comprising feed gas used to create an etch plasma,
   where $Sel_{min} = d_{underlying\ layer}/(d_{antireflective\ layer} + d_{hard\ mask\ layer})$,
   where $Sel_{max} = d_{underlying\ layer}/d_{antireflective\ coating\ layer}$,
   where $d_{under\ layer}$ = thickness of said underlying layer,
   where $d_{antireflective\ coating\ layer}$ = thickness of said antireflective coating layer,
   where $d_{hard\ mask\ layer}$ = thickness of said hard mask layer, 2) selecting X flow rate so that $Sel_{max}$ is greater than Sel(X flow rate), which is greater than $Sel_{min}$;

3) etching a pattern into said directly underlying layer to be etched and determining:
   a) if essentially all of said residue of said oxygen-containing antireflective coating layer has been removed during said etching, and if it has not, increasing X flow rate,
   b) if said hard mask layer is sufficiently intact to be functional, and if it is not, decreasing X flow rate,
   c) whether a profile of said pattern etched into said directly underlying layer meets a requirement, and if it does not, adjusting at least one process variable selected from the group consisting of source power, bias power, and process chamber pressure;

4) repeating step c) until essentially all of said oxygen-containing antireflective coating layer is removed, said hard mask layer is sufficiently intact to be functional, and said profile of said pattern meets said requirement; and 5) using said determined etch process conditions to process a series of semiconductor substrates, each comprising a residue of said oxygen-containing antireflective coating layer and a directly underlying layer of said directly underlying layer material.

19. The method of claim 18, wherein said directly underlying layer is selected from the group consisting of a polycide, a metal silicide, tungsten, polysilicon, and doped polysilicon.

* * * * *